(12) United States Patent
Mears et al.

(10) Patent No.: US 6,741,624 B2
(45) Date of Patent: May 25, 2004

(54) FABRY-PEROT LASER WITH WAVELENGTH CONTROL

(75) Inventors: Robert J. Mears, Wellesley, MA (US); Augustin Yiptong, Waltham, MA (US); Adam D. Cohen, Milford, MA (US)

(73) Assignee: R J Mears LLC, Newton, MA (US)

( * ) Notice: Subject to any disclaimer, the term of this patent is extended or adjusted under 35 U.S.C. 154(b) by 0 days.

(21) Appl. No.: 10/064,002

(22) Filed: Jun. 3, 2002

(65) Prior Publication Data

US 2002/0196826 A1 Dec. 26, 2002

Related U.S. Application Data

(63) Continuation-in-part of application No. 09/914,944, filed as application No. PCT/GB00/00768 on Mar. 3, 2000.

(30) Foreign Application Priority Data

Mar. 5, 1999 (GB) .............................................. 9905196
May 21, 1999 (GB) .............................................. 9911952

(51) Int. Cl.[7] .................................................. H01S 3/10
(52) U.S. Cl. ......................................... 372/45; 372/43
(58) Field of Search ...................... 372/45, 43; 359/248, 359/250; 257/13, 14

(56) References Cited

U.S. PATENT DOCUMENTS

| | | | | |
|---|---|---|---|---|
| 4,503,541 A | * | 3/1985 | Weller et al. | .................. 372/50 |
| 5,245,474 A | | 9/1993 | Chabassier et al. | |
| 5,388,173 A | | 2/1995 | Glenn | |
| 5,666,224 A | | 9/1997 | Wood et al. | |
| 5,742,433 A | | 4/1998 | Shiono et al. | |
| 5,815,307 A | * | 9/1998 | Arbore et al. | .............. 359/328 |
| 5,867,304 A | | 2/1999 | Galvanauskas et al. | |
| 6,141,370 A | | 10/2000 | Avrutsky et al. | |
| 6,249,624 B1 | * | 6/2001 | Putnam et al. | ................. 385/37 |
| 6,322,938 B1 | | 11/2001 | Cohn | |
| 6,337,868 B1 | * | 1/2002 | Mizutani | ..................... 372/27 |

FOREIGN PATENT DOCUMENTS

| | | | |
|---|---|---|---|
| EP | 0712012 A | 11/1994 | |
| WO | WO 96/11416 | 4/1996 | |
| WO | WO 98/32187 | 1/1998 | |
| WO | 01/18924 A1 | 3/2001 | ............. H01S/5/22 |

OTHER PUBLICATIONS

Avrutsky, I. A. et al. Design of Widely Tunable Semiconductor Lasers and the Concept of Binary Superimposed Gratings (BSG's). *IEEE J. Quantum Electronics* 34, 729–741.

(List continued on next page.)

*Primary Examiner*—Paul Ip
*Assistant Examiner*—Dung T Nguyen
(74) *Attorney, Agent, or Firm*—Allen, Dyer, Doppelt, Milbrath & Gilchrist, P.A.

(57) ABSTRACT

A laser device, in particular a semiconductor laser, emitting optical radiation with a defined mode pattern can be produced from a standard Fabry-Perot (FP) laser by post-processing at the wafer level, i.e. before the wafer is separated into individual dies by cleaving/dicing. A sub-cavity is formed within the FP laser cavity. The sub-cavity has a predetermined length and is located between the FP facets. An aperiodic grating composed of a small number of contrast elements, typically less than 10, with predetermined inter-element separations and predetermined spacings relative to the sub-cavity is formed on or in the optical waveguide. The inter-element separations and the spacings relative to the sub-cavity produce a filtering function of the aperiodic grating for optical radiation propagating in the waveguide. The laser device is suitable for telecommunications applications due to its high side-mode-suppression ratio and narrow-linewidth.

31 Claims, 6 Drawing Sheets

OTHER PUBLICATIONS

Chang, C. P. et al. Optimization of a thin–film multilayer design by use of the generalized simulated–annealing method. *Optics Letters* 15, 595–597 (Jun. 1, 1990).

Cohn, R. W. et al. Nanolithography Considerations for Multi–Passband Grating Filters. *Optical Review* 6, 345–354 (1999).

DeChiaro, L. F. Spectral Width Reduction in Multi–longitudinal Mode Lasers by Spatial Loss Profiling. *J. Lightwave Technology* 9, 975–986 (Aug. 1991).

Erni, D. et al. Evolutionary optimization of non–periodic coupled–cavity semiconductor laser diodes. *Optical and Quantum Electronics* 30, 287–303 (1998).

Gauggel, H.–P. et al. Wide–Range Tunability of GaInP–AlGaInP DFB Lasers with Superstructure Gratings. *IEEE Photonics Tech. Letters* 9, 14–16 (Jan. 1997).

Kozlowski, D. A. et al. Time–Domain Modeling of Mode Suppression in 1.3–$\mu$m Fabry–Perot Lasers. *IEEE Photonics Technology Letters* 8, 755–757 (Jun. 1996).

Sarlet, G. et al. Optimization of Multiple Exposure Gratings for Widely Tunable Lasers. *IEEE Photonics Technology Letters* 11, 21–23 (1999).

Tsang, H. K. et al. Etched Cavity InGaAsP/InP Waveguide Fabry–Perot Filter Tunable by Current Injection. *J. Lightwave Technology* 17, 1890–1895 (Oct. 1999).

\* cited by examiner

FABRY-PEROT LASER WITH WAVELENGTH CONTROL

CROSS REFERENCE TO RELATED APPLICATIONS

This application is a continuation-in-part of U.S. patent application Ser. No. 09/914,944, filed Sep. 5, 2001, the content of which is incorporated herein by reference in its entirety.

BACKGROUND OF INVENTION

FIELD OF THE INVENTION

The invention is directed to semiconductor lasers with a high side-mode-suppression ratio and narrow-linewidth for telecommunications applications, and more particularly to a Fabry-Perot semiconductor laser that can be post-processed into such a device at the wafer level, i.e. before the wafer is separated into individual dies by cleaving/dicing.

Fabry-Perot (FP) lasers have multiple lasing modes within the envelope of the gain spectrum, with the modes being separated by the Free Spectral Range (FSR), which is determined by the length of the laser cavity between facets and the effective refractive index and the dispersion of the active layer. FP lasers are used today in short-reach (typically Local Area or Wide Area Networks) applications, where their relatively large effective linewidth due to multiple lasing modes around the nominal emission wavelength can be tolerated. However, their large linewidth can cause intersymbol interference due to the cumulative effects with distance of the optical fiber's chromatic dispersion, thus precluding their use over longer transmission distances, for example, in Metropolitan Area (MA) and Long Haul (LH) networks. A large linewidth can also cause crosstalk problems (or conversely, channel spacing limitations) when the channel spacing in DWDM networks is decreased. Typically, spans in MA and LH networks require the use of single-mode narrow-linewidth laser diodes such as Distributed Feedback (DFB) lasers. DFBs have a grating extending along or close to the active layer, and tend to lase in a single mode and have both a high side-mode-suppression ratio (SMSR) and a narrow linewidth. However, the complex etch and regrowth processes required to write the grating and passivate afterwards before continuing to lay down the upper device layers make DFBs very expensive to manufacture compared to FP lasers.

Attempts have been reported in the past for transforming a FP laser into a quasi-single-mode laser by post-growth processing.

WO 01/18924A1 discloses forming a two-dimensional pattern of etched recesses outside the waveguide region of a semiconductor laser, thereby changing the effective refractive index of the waveguide near the holes. However, the effective index contrast is low and, compared to the technique disclosed herein, the number of features has to be increased by about two orders of magnitude to stabilize single-mode operation.

Another approach for forcing a FP laser into single-mode operation is described by Kozlowski et al. in IEEE Photonics Technology Letters Vol. 8, No. 6, pp. 755–7, 1996. Recesses that extend as far down as the upper edge of the active layer of a FP laser are formed in order to suppress certain modes. However, the design of Kozlowski et al. requires that the recesses be located at an integer fraction of the laser length L, e.g. L/2, L/4 or L/8, from a laser facet. Because the recesses are preferably formed before the wafer is cleaved into laser dies and due to the uncertainty of several microns in the as-cleaved length of any given laser die, this technique can only be performed with accuracy on discrete, mounted laser devices, the lengths of which have been measured. The process is therefore difficult to realize in practical applications and expensive to implement.

Another approach has been proposed by DeChiaro in J. Lightwave Technol., Vol. 9, No. 8, pp. 975–986, August 1991, wherein absorbing regions are introduced at appropriate locations along the optical axis of the device. The absorption regions are also placed at sites that are predetermined integer fractions of the laser length which again requires that the length of the FP laser be accurately known.

It would therefore be desirable to produce a quasi-single-mode laser with a high SMSR from a conventional FP laser without prior definition of the cavity length of the FP laser. It would further be desirable to produce such lasers economically using standard laser processing tools at the wafer level, i.e., before dicing/cleaving the wafer into individual devices.

SUMMARY OF INVENTION

The systems and methods described herein include systems and methods that control the lasing modes of a Fabry-Perot (FP) laser, and more particularly to a semiconductor FP laser that can be post-processed into such device at the wafer level, i.e. before the wafer is separated into individual laser dies by cleaving/dicing.

According to one aspect of the invention, a laser device includes a laser cavity having an optical waveguide and facets defining first lasing modes and a sub-cavity formed within the laser cavity. The sub-cavity has a predetermined length and is located between the facets, wherein the predetermined sub-cavity length defines second lasing modes having a free spectral range (FSR) that is greater than a FSR of the first lasing modes. The device further includes a plurality of contrast elements having predetermined inter-element separations and predetermined spacings relative to the sub-cavity, wherein the contrast elements interact with the optical waveguide and form an aperiodic grating. The inter-element separations and the spacings produce a filtering function of the aperiodic grating for optical radiation propagating in the waveguide.

The small sub-cavity is designed to expand the mode spacing of the FP laser. In addition, an aperiodic grating filter in the form of contrast elements (typically fewer than 20) is applied along the waveguide, i.e., between the facets and inside and/or outside the sub-cavity, that has a transmission passband at the desired lasing wavelength and substantially a stop-band over a range of adjacent frequencies on both sides of the desired lasing wavelength. The contrast elements can be formed in or adjacent to the waveguide layer of the laser.

Embodiments of the invention can include one or more of the following features. The sub-cavity length can be defined by at least two discontinuities, such as trenches and/or cleaves, extending into the optical waveguide. The waveguide can include an upper cladding layer, wherein the contrast elements comprise regions having an index of refraction that is different from an index of refraction of the upper cladding layer and/or of the waveguide. The filtering function can cause the laser device to emit laser radiation with at least one defined mode. Preferably, the emitted laser radiation can be single-mode. A contact layer can be disposed at least over the length of the sub-cavity, but may also be disposed over the waveguide region located between the facets. The facets can be anti-reflection coated.

The laser device can also be implemented as a surface-emitting laser by forming at least one of the facets as an inclined facet that directs the optical radiation propagating in the waveguide in a direction substantially normal to the waveguide. Alternatively, at least one of the facets can be oriented perpendicular to the waveguide and located opposite to a reflecting facet that directs the optical radiation propagating in the waveguide in a direction substantially normal to the waveguide.

According to another aspect of the invention, a method for producing optical radiation with a desired mode structure includes producing an optical waveguide capable of propagating the optical radiation; forming in the optical waveguide a sub-cavity with a predetermined length, the sub-cavity producing a sub-cavity mode structure that overlaps with the desired mode structure; and forming along the optical waveguide an aperiodic filter having contrast elements, the aperiodic filter filtering the sub-cavity mode structure to generate the desired mode structure. The optical filter is generated by defining a cost function representing a goodness of fit between the desired mode structure and an actual spectral response of the filter; assigning to each contrast element of the aperiodic filter at least one characteristic attribute; generating an initial arrangement of the contrast elements along the optical waveguide; and iteratively modifying at least one characteristic attribute of at least one of the contrast elements and computing for each iteration a cost function. If the computed cost function for an iteration is less than a predetermined cost function value, a corresponding arrangement of the contrast elements is selected as an optimal arrangement of the contrast elements to provide the desired mode structure.

Embodiments can include one or more of the following features. The optimal arrangement of the contrast elements can define a spatial layout of the contrast elements relative to one another and relative to the sub-cavity. Facet locations can be defined along the optical waveguide, the facet locations defining Fabry-Perot modes, wherein the sub-cavity and the optimally arranged contrast elements are located between the facet locations. The distance between the facet locations, on one hand, and the sub-cavity and the optimally arranged contrast elements, on the other hand, need only be known approximately. The characteristic attributes of the contrast element can be a refractive index, a physical dimension, such as a width and/or height, or a spacing between adjacent contrast elements.

Further features and advantages of the present invention will be apparent from the following description of preferred embodiments and from the claims.

BRIEF DESCRIPTION OF DRAWINGS

The following figures depict certain illustrative embodiments of the invention in which like reference numerals refer to like elements. These depicted embodiments are to be understood as illustrative of the invention and not as limiting in anyway.

DETAILED DESCRIPTION

The systems and methods described herein are directed to a modified FP laser that produces quasi-single-mode laser emission. In particular, the modified FP laser described herein can be fabricated by post-processing of standard FP lasers at the wafer level under relaxed tolerances for the subsequent cleaving process.

Figure 1:
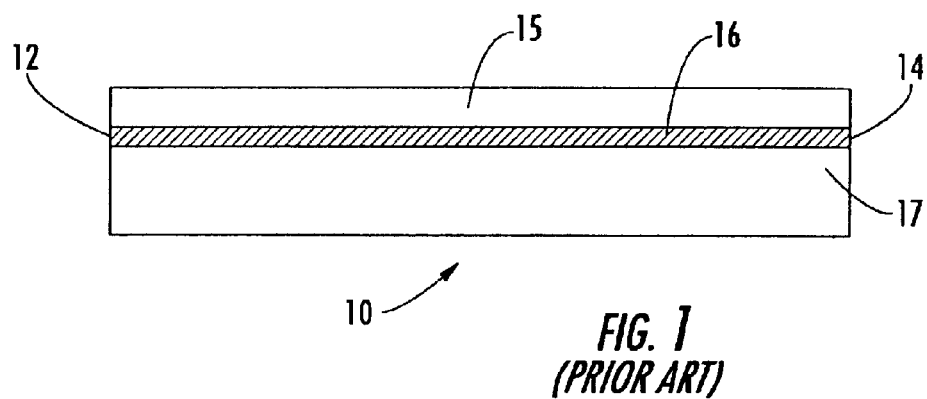
FIG. 1 shows schematically a conventional Fabry-Perot (FP) laser.

Referring now to FIG. 1, a conventional FP laser cavity 10 is defined by two facets 12, 14 that can be cleaved, etched, milled or prepared by any other method known in the art. The facets 12, 14 are typically coated to control their reflectivity and prevent degradation when exposed to ambient atmosphere. Laser radiation propagates in the waveguide 16 which is formed of a material having a higher index of refraction than the adjacent cladding layers 15, 17.

Figure 2:
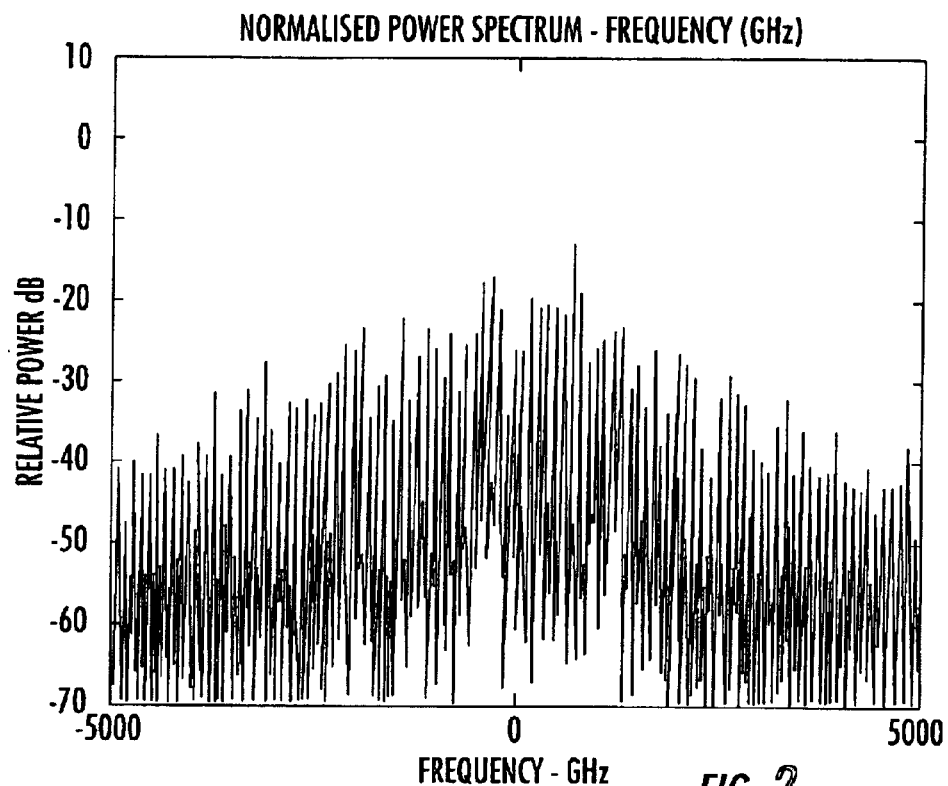
FIG. 2 shows schematically above-threshold laser modes of the FP laser of FIG. 1.

The exemplary FP laser of FIG. 1 has a length of 400 $\mu$m and can have multiple lasing modes within the envelope of the gain spectrum, as illustrated in the simulated spectral emission of laser 10 in FIG. 2. The mode spacing is determined by the Free Spectral Range (FSR), which is a function of the length of the laser cavity between facets and the effective refractive index (and its dispersion) of the active layer. In this example, if the refractive index is assumed to be 3.3, then neglecting dispersion the FSR is 113.5 GHz, or ~0.91 nm. FP lasers are poorly suited for applications where a stable laser emission with narrow linewidth is required, such as for DWDM optical telecommunication applications.

The mode spacing of an FP laser is inversely proportional to the cavity length. A shorter cavity FP laser will therefore have a smaller number of cavity modes within the gain curve. In an extreme case, a VCSEL (vertical cavity surface emitting laser) may only support a single mode within its gain curve and will hence operate single mode.

Figure 3:
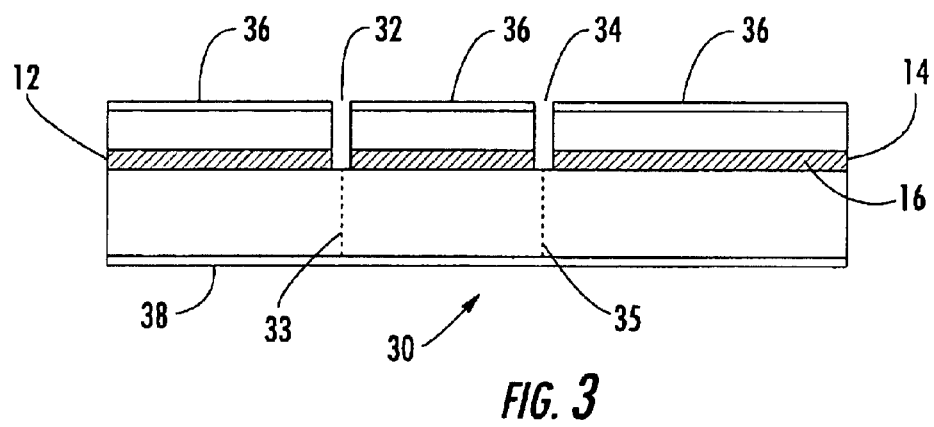
FIG. 3 shows schematically the laser of FIG. 1 with a formed sub-cavity during making of the present invention.
Figure 4:
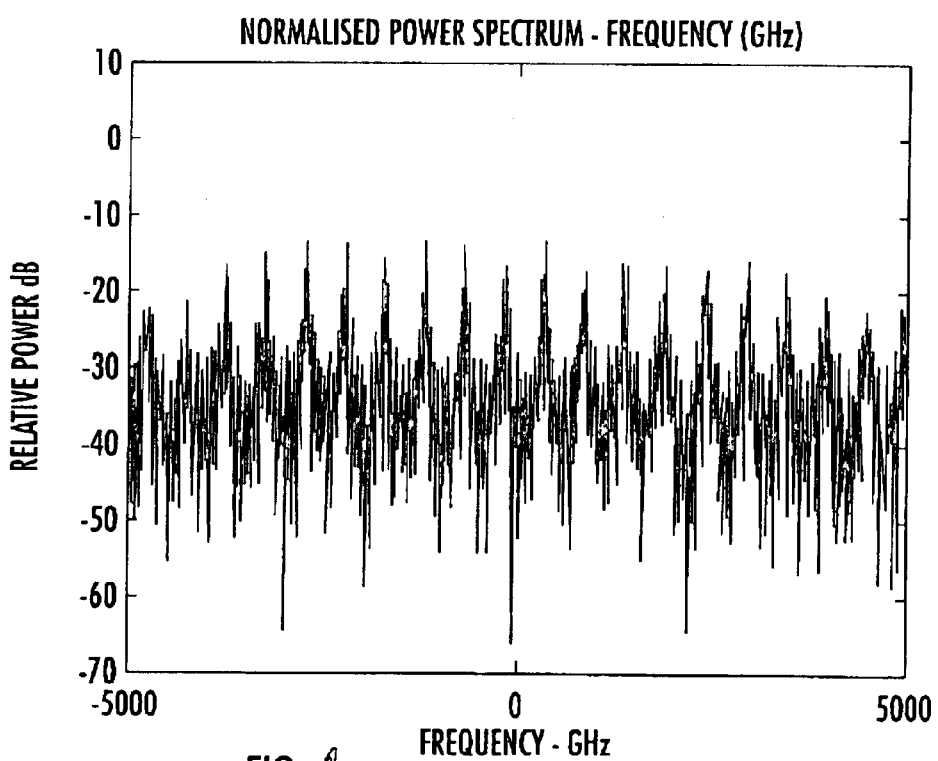
FIG. 4 shows schematically laser modes of the FP laser cavity with the sub-cavity of FIG. 3.

Referring now to FIG. 3, an exemplary FP laser 30 has formed therein, for example, by cleaving (similar to a cleaved-coupled-cavity laser known in the art, with cleaves 33, 35 typically extending through the wafer), by deep etching or ion milling using a focused ion beam (FIB) at least one slot or recess 32, 34 that can extend into the waveguide. Recesses 32 and 34 form a shorter cavity with a reduced number of laser modes. The cleaved facets 12, 14 of laser 30 can be antireflection-coated, so that the mode spacing is predominantly determined by the optical distance between the recesses 32 and 34. A simulated lasing spectrum of an exemplary semiconductor laser having a length of 400 $\mu$m and a spacing between the recesses 32, 34 of 75 $\mu$m is shown in FIG. 4. The mode separation (i.e. FSR) is now increased to approximately 605.7 GHz or ~4.8 nm. Unlike prior art modified FP lasers, wherein the recesses are placed along the waveguide at locations that are an exact fraction of the cavity length defined by the distance between the facets 12 and 14, the emission spectrum of laser 30 is essentially unaffected by the distance of the recesses 32, 34 from the cleaved facets 12, 14.

The length of the sub-cavity between the recesses 32, 34 is preferably selected such that one mode coincides with a desired single-line spectral response, with the other supported modes selected so as not to coincide with other wavelength channels (e.g. ITU defined) in use in the communications system in which the laser is to be deployed.

The laser 30 as well as the other laser structures 10, 50 described herein are typically electrically pumped. For this purpose, contact layers 36 and 38 are applied to opposite sides of the laser structures 10, 30, 50. The contact layers 36, 38 may extend over the entire cavity length between facets 12, 14 or only over a specified portion of the cavity. Lasers having, for example, unpumped end regions proximate to the facets 12, 14 are known in the art.

FIG. 4 shows a simulated emission spectrum of the FP laser 30 of FIG. 3 with the recesses 32, 34 formed in the waveguide 16. The spectrum is still multimode. However, the modes are spaced farther apart than those of laser 10, as determined by the optical length of the waveguide between the recesses 32, 34.

Figure 5:
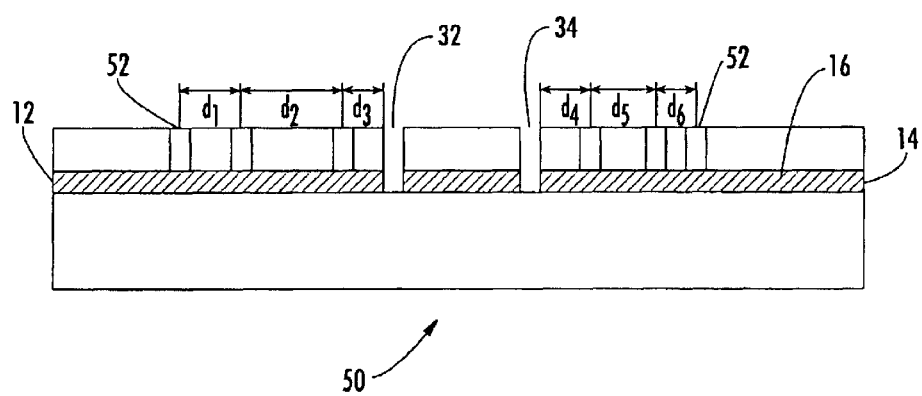
FIG. 5 shows schematically an aperiodic grating formed in the laser structure of FIG. 3.

As illustrated in FIG. 5, in a second step of the fabrication process of the modified FP laser, a small number of, in the example given a total of six, "contrast" elements 52 that form an aperiodic grating structure are added to the laser structure 30 of FIG. 3. The aperiodic grating structure can be formed, for example, by implanting ions to alter the doping level or composition near the waveguide 16 using FIB, lithography and/or diffusion. Optimal spacings $d_1$, $d_2$, $d_5$, $d_6$ between the contrast elements 52 themselves as well as spacings $d_3$ and $d_4$ between a contrast element 52 and a respective recess 32, 34 are calculated using an "annealing-"method with a random seed. Details of this method will be described in detail below. The calculated values are $d_1$=46.88, $d_2$=90.63, $d_3$=34.38, $d_4$=46.88, $d_5$=50 and $d_6$=6.25 μm, respectively. It should be emphasized that the relative lengths $d_i$ are critical, while the distances between the contrast elements 52 and AR-coated facets 12, 16 is are not important and need not be tightly controlled. The aperiodic grating operates collectively to further filter the cavity modes produced by the recesses 32, 34.

Figure 6:
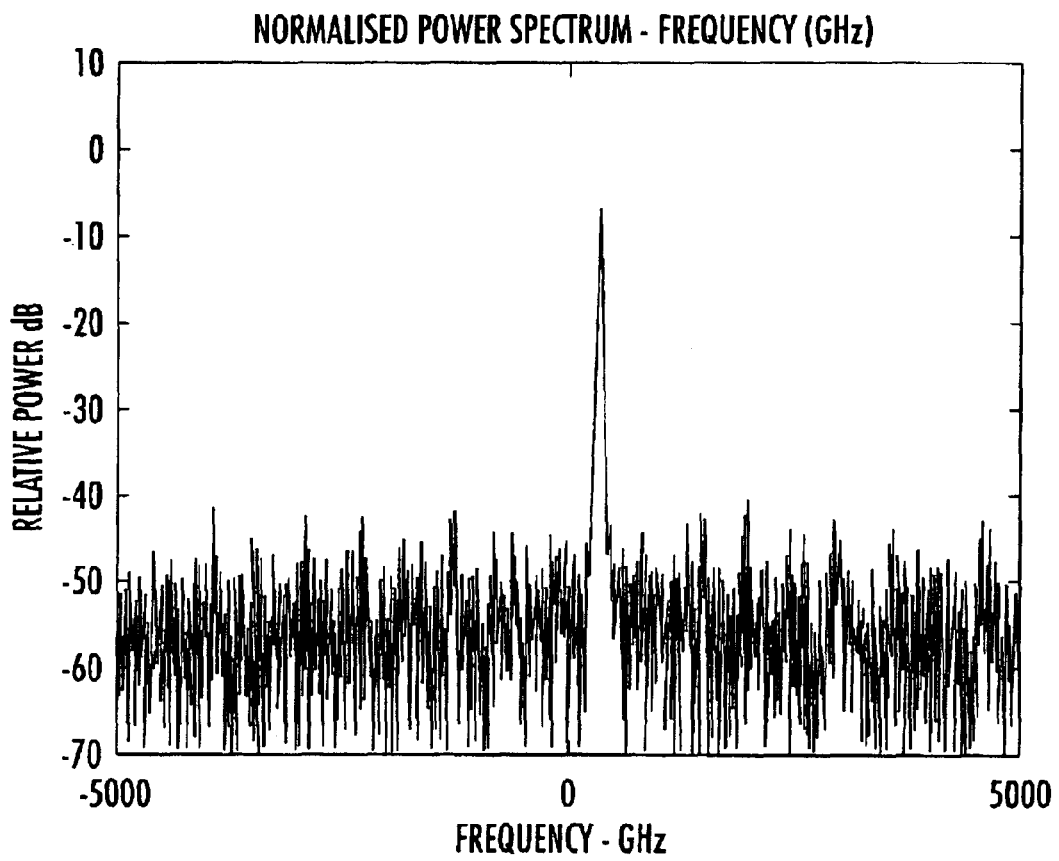
FIG. 6 shows schematically laser modes of the FP laser cavity of FIG. 5.

Modes of the exemplary aperiodic grating are depicted in the diagram of FIG. 6. The cavity with the trenches and the grating elements are simulated using a simplified laser model which takes into consideration gain without full reference to rate equations. The gain spectrum is represented in this model by an enlarged spectral width consistent with the objective of single-mode high-SMSR lasing over a wide temperature range, utilizing a simple device packaging scheme without temperature control, i.e. 'uncooled'. The exemplary modified Fabry-Perot laser is designed using a software design program that can be readily written in a high-level language such as MATLAB™, available from MathWorks Inc., Natick, Mass.

The aperiodic grating can be designed for the device 30 by starting with a simulated grating having grating elements, i.e., the "contrast" elements, with initial positions along the waveguide 16 defined by a random seed value. Several constraints may be applied to the grating elements, such as a minimum manufacturable feature size, a desired maximum number of grating elements, etc. The grating lines do not define a plurality of coupled cavities within the overall laser cavity to increase mode spacing, but rather represent a filter that has a transmission passband at the desired lasing wavelength and substantially a stop-band over a range of adjacent frequencies on both sides of the desired lasing wavelength. Thus, consistent with the desired spectral response, an arbitrary number of sidemodes adjacent to the lasing wavelength may be suppressed.

Figure 7:
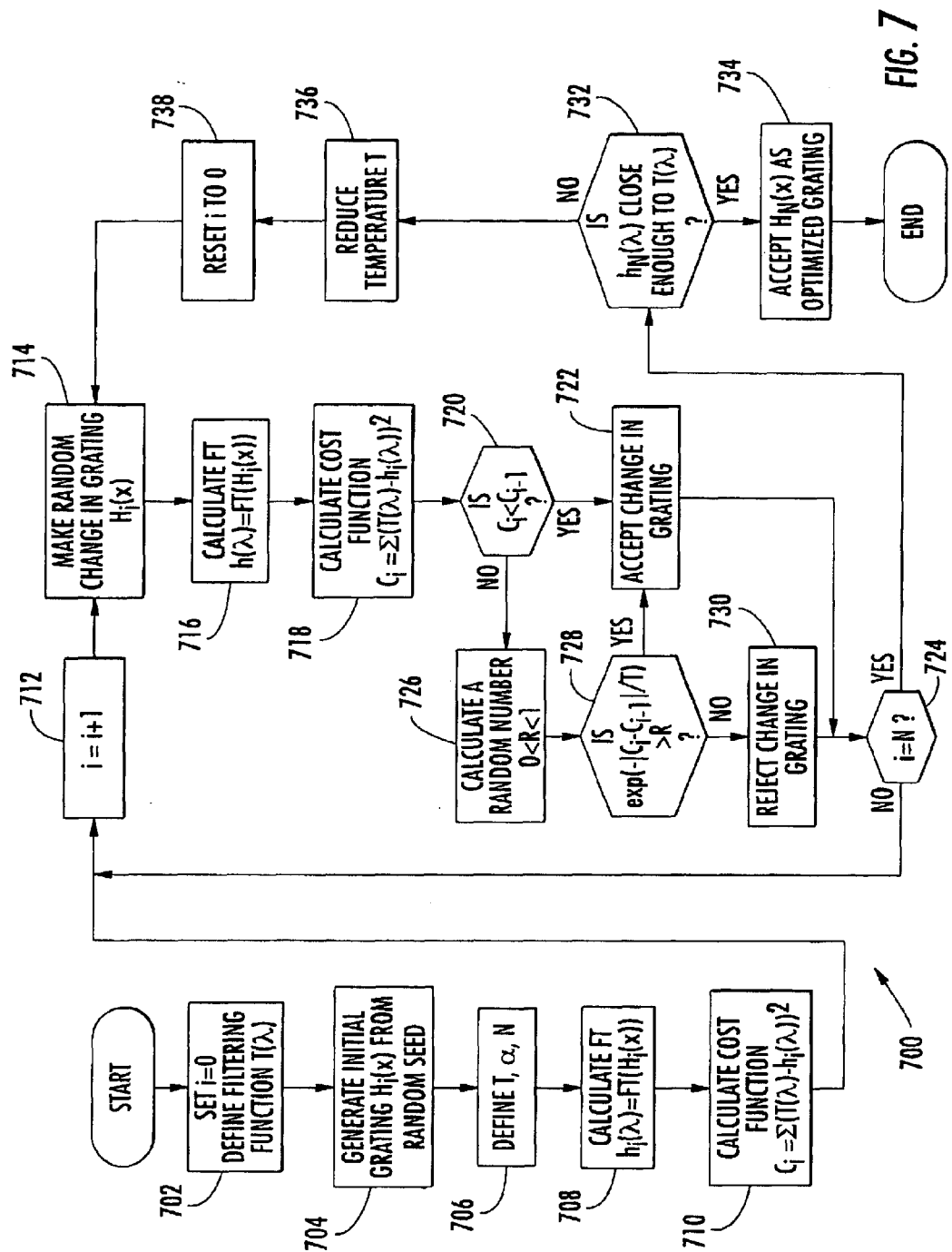
FIG. 7 is a flowchart of a process for computing an optimized aperiodic grating structure.

FIG. 7 is a schematic flow diagram of an optimization algorithm suitable for carrying out the invention. An optimization algorithm of this type is commonly referred to as simulated annealing.

Simulated annealing is a process which mimics actual annealing of a material by heat treatment. The material is hereby heated up and then slowly cooled down. Previously displaced atoms will then move into their respective equilibrium positions, and dislocations and defects will be largely eliminated.

In simulated annealing, a cost-function takes the place of the potential energy of an atom. The aim of the process is to locate a global minimum in cost space, by randomly "hopping" solutions around (a "hot" system) and then gradually "cooling" the system, thereby reducing the size of the random hops. If the cooling rate is chosen correctly, the solution will hop into the global minimum while the system is hot and be kept there as the system cools.

A flowchart of the optimization process 700 is depicted in FIG. 7. The process 700 starts with step 702 by setting an index i=0 and defining a target filtering function T (λ) which represents, for example, a desired spectral output as a function of the wavelength λ of the exemplary laser structure 10 or 30. A random seed value representing a possible grating structure within selected confines, such as refractive index step, manufacturable feature size, etc., is selected, generating an initial, typically aperiodic, real space grating structure $H_0$ (x), step 704, wherein x represents a coordinate along the length of waveguide 16. An initial simulated annealing "temperature"$T_0$, a cooling rate α, and a limit N for the number of iterations can also be assigned at this time, step 706. In step 708, the Fourier Transform (FT) of the initial real space grating structure $H_0$ (x) is calculated, giving an initial filtering function $h_0$ (λ)=FT [$H_0$ (x)].

A cost function $$C_0 = \Sigma(T(\lambda) - h_0(\lambda))^2$$

is calculated over the spectral range of interest, step 710. As can be seen, the cost function $C_0$ will decrease when the fit between the target filtering function and the calculated filtering function (FT of the real space grating structure) improves. To test if the cost function can be lowered, the index i is increased by 1, step 712, and a characteristic feature of a randomly selected element in the grating structure $H_0$ (x) is modified to produce a new grating, $H_1$ (x), step 714. The characteristic feature can be a refractive index of an element, a width and/or height of an element, and/or a spacing between elements or groups of elements. In step 716, the FT of the modified real space grating $H_i$ (x) is calculated, yielding a new filtering function $h_i$ (λ)=FT [$H_i$ (x)]. A new cost function $$C_2 = \Sigma(T(\lambda) - h_2(\lambda))^2$$

is calculated, step 718, and compared with the cost function $C_{i-1}$ for the previous grating structure, i.e. initially with $C_0$ for the initial grating $H_0$ (x). If it is determined in step 720 that the new cost function $C_i$ is lower than the cost function $C_{i-1}$, then the new grating is accepted as an improved structure and used as a basis for subsequent iterations, step 722. If the maximum number of iterations N has not been reached, as determined in step 724, then the index i is incremented by 1, step 712, and the process returns to step 714.

Conversely, if it is determined in step 720 that the new cost function $C_i$ is $\geq C_{i-1}$, then a random number R between 0 and 1 is computed, step 726, and it is checked in step 728 if $$exp(-|C_2-C_{i-1}|/T)>R$$

in which case the new grating is accepted and the process 700 returns to step 722. However, if the difference between $C_i$ and $C_{i-1}$ is such that $$exp(-|C_2-C_{i-1}|/T)\leq R,$$

then the new grating $H_i(x)$ is rejected and the element or feature previously changed in step 714 is returned to its previous state and the process returns to step 714 via the steps 724 and 712 described above.

If the limit N for the number of iterations has been reached, as determined in step 724, the process 700 checks in step 732 if the Fourier transform $h_N(\lambda)$=FT $[H_N(x)]$ of the grating $H_N(x)$ is sufficiently close to the target function $T(\lambda)$, for example, by computing the cost function $$C_N=\Sigma(T(\lambda)-h_N(\lambda))^2,$$

and should therefore be accepted as an "optimized" structure, step 734. Those skilled in the art will, of course, appreciate that this "optimized" structure may be a locally, but not necessarily a globally optimized structure, which is mathematically difficult to obtain unless the entire search space is investigated.

If it is determined in step 732 that $h_N(\lambda)$ is not sufficiently close to the target function $T(\lambda)$, then the annealing temperature T is multiplied by a predetermined factor $\alpha<1$, i.e., the system is "cooled down", step 736, and the loop counter i is set again to zero, step 738. The process 700 then return to step 714 for another random grating change.

The cooling rate $\alpha$ is typically kept constant throughout the annealing process. If $h_i(\lambda)$ does not change after executing additional loops, the process is stopped (not shown) as this may be a sign that the temperature is too low for further changes.

Practical limitations of the fabrication process may impose constraints on the parameters of the design model. For example, certain dimensions of the grating elements and spacing between the grating elements may be dictated by the feature sizes achievable with photolithography and/or focused ion beam milling. Additionally, the grating lines can also have different shapes, as long as these shapes can be adequately and efficiently modeled and manufactured, including but not limited to V-shaped features and cylindrical 'holes'. As mentioned above, the model assumes that following dicing/cleaving the cleaved laser facets will be antireflection coated for the wavelength range of operation. The laser performance is substantially independent of the absolute position of the grating elements relative to the laser facets, and also of the laser facet reflection phase. Instead, the performance depends on the relative positions of the grating elements along the waveguide 16.

The modified FP laser can also be designed to operate as a surface emitting laser. In this way, the basic operation of the laser can be tested by applying electrical probes at the wafer level, i.e. before cleave/dice and mounting etc. Lasers can then simply be mapped and those lasers that do not meet established performance criteria can be marked and discarded at time of cleave/dicing. This can represent a considerable cost saving compared with the alternative standard methods for edge-emitting lasers, in which individual lasers have to be cleaved, diced and mounted prior to testing even their basic performance.

Figure 8:
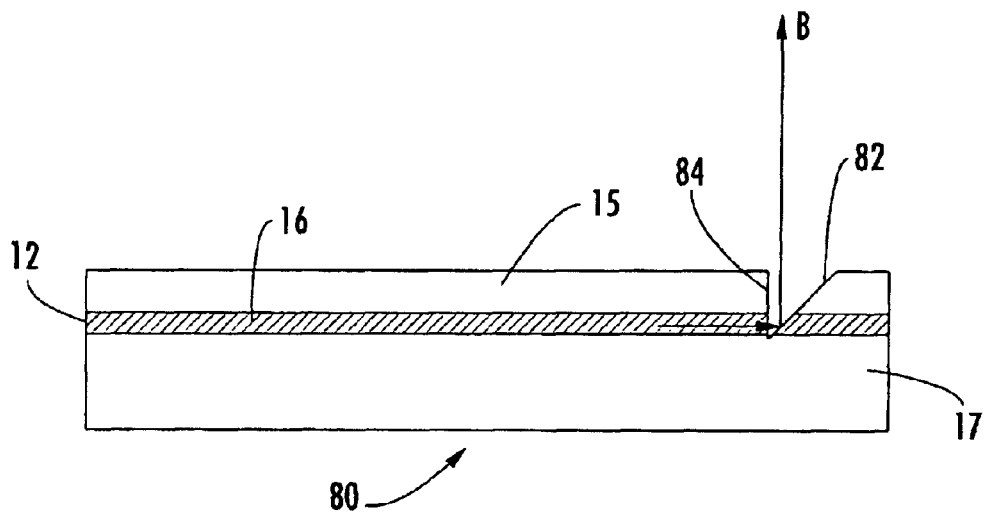
FIG. 8 shows an embodiment of a conventional vertically emitting laser with a horizontal waveguide.
Figure 9:
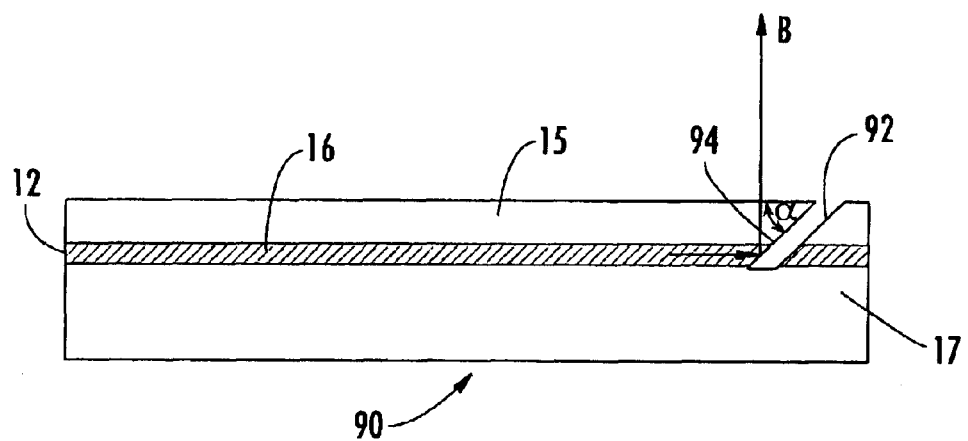
FIG. 9 shows another embodiment of a conventional vertically emitting laser with a horizontal waveguide.

FIG. 8 shows schematically a surface-emitting laser 80 with a horizontal-cavity laser using a turning mirror 82. Optical radiation propagating in the waveguide 16 exits the waveguide through facet 84 and is reflected by the turning mirror 82. The angle of the turning mirror 82 relative to the waveguide 16 can be selected so that emitted beam B has a predetermined direction relative to the wafer surface. Facets 84 and turning mirror 82 can be formed on one end of the optical cavity, as indicated in FIG. 8, or on both ends (not shown). To achieve high reflectivity, the turning mirror 82 is preferably coated with a dielectric or metallic high-reflectivity coating. Alternatively, as depicted in FIG. 9, a single trench 92 can be formed that extends beyond the active region at an angle $\alpha$ relative to the laser chip surface. The optical radiation propagating in the waveguide is totally internally reflected at the interface 94 at an angle $2\alpha$ relative to the wafer surface. For a surface-emitting laser emitting normal to the wafer surface, the angle $\alpha$ is 45°. For sake of clarity, the surface-emitting structures of FIGS. 8 and 9 are illustrated for a conventional FP laser 10, and it will be understood that the surface-emitting structures can be readily employed with the laser devices 30 and 50 of the invention.

The laser device structure, such as the structure 10 of FIG. 1, can be produced by a conventional epitaxial process, such as MBE or MOCVD. Trenches 32, 34 can be milled through an applied top contact layer and upper cladding layers into the active layer to define the short cavity (FIG. 1), for example, by FIB milling using a Focused Ion Beam (FIB) apparatus, such as Model DB 235825i manufactured by FEI Corp, Hillsboro, Oreg. Other processes for forming the trenches or other suitable discontinuities can also be used, such as electron beam lithography followed by a robust etching technique compatible with high aspect ratio deep etching that preserves good sidewall smoothness, for example, ECR/ICP etching using chlorine chemistry. Alternatively, the sub-cavities can also be produced by cleaving through the wafer. The etched sidewalls should be smooth to limit scattering in the laser cavity.

The upper surface can be passivated, for example, by depositing or spin-coating a suitable polymer material of suitable viscosity or a glass. Photoresist could be used to delineate openings for forming the elements/features of the aperiodic grating structure. Other materials, for example, a dielectric material such as $SiO_2$ or $Si_3N_4$, can also be deposited over the surface and into the grating trenches, consistent with the design being based on the implied index contrast, and consistent with minimal thermal strain effects.

The contrast elements of the aperiodic grating can be defined by aligning a photomask that includes the features of the aperiodic grating with the trenches of the sub-cavity. Photolithographic processes known in the art can then be employed to define openings in the top contact or cladding layer to form the contrast elements, for example, by impurity diffusion, ion milling, chemical etching, and the like. It should be noted that the contrast elements do not have to project into the waveguide layer, but need only disturb the refractive index of the waveguide region. Accordingly, design criteria similar to those employed with DFB and DBR laser structures can be adopted. In an exemplary embodiment utilizing an FIB-based process on a buried heterostructure, the contrast elements are created as follows: the metallization of the top contact layer is removed to create a window by setting the beam current sufficiently high to mill through the contact layer. The beam current can then be reduced to a level consistent with ion implantation through the opened window. A calibrated FIB implantation procedure, followed by an optional annealing step, creates contrast elements of the desired index contrast by implantation/diffusion of gallium ions into the upper cladding layer. Those skilled in the art will appreciate that windows can also be defined in the top contact layer by lithography for a subsequent wafer-level impurity diffusion, which may be preferable over ion implantation depending on the desired index contrast, the number of contrast features, and global calculations of throughput and process cost per device yielded.

While the invention has been disclosed in connection with the preferred embodiments shown and described in detail, various modifications and improvements thereon will become readily apparent to those skilled in the art. For example, the laser device can be an optically pumped semiconductor laser, an optically pumped solid state laser having a waveguide region or an optically pumped fiber laser. The device can also be made of a bulk material, such as a Nd:YAG crystal, with the trenches and aperiodic grating structure including discontinuities in the refractive index produced, for example, by mechanical means, impurity diffusion and the like. Accordingly, the spirit and scope of the present invention is to be limited only by the following claims.

What is claimed is:

1. A laser device comprising:
    a laser cavity comprising an optical waveguide and facets defining first lasing modes;
    a sub-cavity within said laser cavity, said sub-cavity having a predetermined length and being located between said facets, said predetermined sub-cavity length defining second lasing modes having a free spectral range (FSR) that is greater than a FSR of the first lasing modes; and
    a plurality of contrast elements adjacent said sub-cavity and having predetermined inter-element separations and predetermined spacings relative to said sub-cavity, said contrast elements interacting with said optical waveguide and forming an aperiodic grating to produce a filtering function for optical radiation propagating in said optical waveguide.

2. The laser device of claim 1, wherein said sub-cavity length is defined by at least two discontinuities extending into said optical waveguide.

3. The laser device of claim 2, wherein said at least two discontinuities are implemented in the form of trenches.

4. The laser device of claim 2, wherein said at least two discontinuities are implemented in the form of cleaves.

5. The laser device of claim 1, wherein said contrast elements comprise regions having an index of refraction that is different from an index of refraction of the waveguide.

6. The laser device of claim 1, wherein said waveguide includes an upper cladding layer, and wherein said contrast elements comprise regions having an index of refraction that is different from an index of refraction of the upper cladding layer.

7. The laser device of claim 1, wherein said filtering function causes the laser device to emit laser radiation having at least one defined mode.

8. The laser device of claim 7, wherein said emitted laser radiation is single-mode.

9. The laser device of claim 1, further including a contact layer disposed at least over the length of the sub-cavity.

10. The laser device of claim 1, wherein said facets are anti-reflection coated.

11. The laser device of claim 1, wherein at least one of said facets is implemented as an inclined facet that directs the optical radiation propagating in the waveguide in a direction substantially normal to the waveguide.

12. The laser device of claim 1, wherein at least one of said facets is disposed opposite to a reflecting facet that directs the optical radiation propagating in the waveguide in a direction substantially normal to the waveguide.

13. Method of producing optical radiation with a desired mode structure, comprising:
    producing an optical waveguide capable of propagating said optical radiation;
    forming in said optical waveguide a sub-cavity with a predetermined length, said sub-cavity producing a sub-cavity mode structure that overlaps with the desired mode structure; and
    forming along said optical waveguide an aperiodic filter having contrast elements, said aperiodic filter filtering the sub-cavity mode structure to generate the desired mode structure, by the acts of:
        defining a cost function representing a goodness of fit between the desired mode structure and an actual spectral response of the filter;
        assigning to each contrast element of the aperiodic filter at least one characteristic attribute;
        generating an initial arrangement of the contrast elements along the optical waveguide;
        iteratively modifying at least one characteristic attribute of at least one of the contrast elements and computing for each iteration a cost function;
        if the computed cost function for an iteration is less than a predetermined cost function value, selecting a corresponding arrangement of the contrast elements as a desired arrangement of the contrast elements to provide said desired mode structure.

14. The method of claim 13, wherein said optimal arrangement of the contrast elements defines a spatial layout of said contrast elements relative to one another and relative to said sub-cavity.

15. The method of claim 13, further comprising defining facet locations along said optical waveguide, said facet locations defining Fabry-Perot modes, and locating said sub-cavity and said optimally arranged contrast elements between said facet locations.

16. The method of claim 15, wherein said sub-cavity mode structure has a free spectral range (FSR) that is greater than a FSR of the Fabry-Perot modes.

17. The method of claim 15, wherein a distance between said facet locations, on one hand, and said sub-cavity and said optimally arranged contrast elements, on the other hand, is defined only approximately.

18. The method of claim 13, wherein said characteristic attribute is a physical dimension of a contrast element.

19. The method of claim 18, wherein said physical dimension is at least one of a width and a height of the contrast element.

20. The method of claim 13, wherein said characteristic attribute is a refractive index of a contrast element.

21. The method of claim 13, wherein said characteristic attribute is a spacing between adjacent contrast elements.

22. A laser device comprising:
    a laser cavity comprising an optical waveguide and facets;
    a sub-cavity within said laser cavity and between said facets; and
    a plurality of contrast elements adjacent said sub-cavity and having predetermined inter-element separations and predetermined spacings relative to said sub-cavity so that said contrast elements interact with said optical waveguide and form an aperiodic grating to produce a filtering function for optical radiation propagating in said optical waveguide.

23. The laser device of claim 22, wherein said sub-cavity length is defined by at least two discontinuities extending into said optical waveguide.

24. The laser device of claim 22, wherein said contrast elements comprise regions having an index of refraction that is different from an index of refraction of the waveguide.

25. The laser device of claim 22, wherein said waveguide includes an upper cladding layer, and wherein said contrast elements comprise regions having an index of refraction that is different from an index of refraction of the upper cladding layer.

26. The laser device of claim 22, further including a contact layer disposed at least over the length of the sub-cavity.

27. A method for making a laser device comprising:

forming a sub-cavity within a laser cavity and between facets thereof; and forming a plurality of contrast elements adjacent said sub-cavity and having predetermined inter-element separations and predetermined spacings relative to said sub-cavity so that said contrast elements interact with said optical waveguide and form an aperiodic grating to produce a filtering function for optical radiation propagating in said optical waveguide.

28. The method of claim 27, wherein said sub-cavity length is formed by extending at least two discontinuities into said optical waveguide.

29. The method of claim 27, wherein forming said contrast elements comprises forming regions having an index of refraction that is different from an index of refraction of the waveguide.

30. The method of claim 27, wherein said waveguide includes an upper cladding layer, and wherein forming said contrast elements comprises forming regions having an index of refraction that is different from an index of refraction of the upper cladding layer.

31. The method of claim 27, further comprising forming a contact layer disposed at least over the length of the sub-cavity.

* * * * *

UNITED STATES PATENT AND TRADEMARK OFFICE
CERTIFICATE OF CORRECTION

PATENT NO. : 6,741,624 B2
DATED : May 25, 2004
INVENTOR(S) : Mears et al.

It is certified that error appears in the above-identified patent and that said Letters Patent is hereby corrected as shown below:

<u>Title page,</u>
Item [56], References Cited, U.S. PATENT DOCUMENTS, insert
-- 5,689,358   A 11/1997   Nakao et al.   …….359/248 --

<u>Column 5,</u>
Lines 30-31, delete "annealing-" method" insert -- annealing" method --
Line 36, delete "is are" insert -- are --

<u>Column 6,</u>
Line 56, delete "$C_2 = \Sigma(T(\lambda)-h_2(\lambda))^2$" insert -- $C_i = \Sigma(T(\lambda) - h_i(\lambda))^2$ --

<u>Column 7,</u>
Line 5, delete "$\exp(-|C_2 - C_{i-1}|/T)>R$" insert -- $\exp(-|C_i - C_{i-1}|/T)>R$ --
Line 10, delete "$\exp(-|C_2 - C_{i-1}|/T) \leq R$" insert -- $\exp(-|C_i - C_{i-1}|/T) \leq R$ --
Line 33, delete "return" insert -- returns --
Line 63, delete "at time" insert -- at the time --

<u>Column 8,</u>
Line 7, delete "Facets" insert -- Facet --

Signed and Sealed this

Fifth Day of October, 2004

JON W. DUDAS
*Director of the United States Patent and Trademark Office*